(12) United States Patent
Ramaswami et al.

(10) Patent No.: US 8,793,545 B2
(45) Date of Patent: Jul. 29, 2014

(54) APPARATUS AND METHOD FOR CLOCK GLITCH DETECTION DURING AT-SPEED TESTING

(75) Inventors: Ravi K. Ramaswami, Cupertino, CA (US); Samy R. Makar, Fremont, CA (US); Anh T. Hoang, Fremont, CA (US)

(73) Assignee: Apple Inc., Cupertino, CA (US)

( * ) Notice: Subject to any disclaimer, the term of this patent is extended or adjusted under 35 U.S.C. 154(b) by 55 days.

(21) Appl. No.: 13/540,670

(22) Filed: Jul. 3, 2012

(65) Prior Publication Data
US 2014/0013173 A1 Jan. 9, 2014

(51) Int. Cl.
*G01R 31/28* (2006.01)

(52) U.S. Cl.
USPC .................. 714/726; 714/733; 714/729

(58) Field of Classification Search
USPC ................. 714/726, 727, 715, 733, 729
See application file for complete search history.

(56) References Cited

U.S. PATENT DOCUMENTS

| | | | |
|---|---|---|---|
| 5,485,466 A * | 1/1996 | Lyon et al. | 714/731 |
| 6,308,291 B1 | 10/2001 | Kock et al. | |
| 7,284,173 B2 | 10/2007 | Napolitano | |
| 7,814,386 B2 * | 10/2010 | Seibold et al. | 714/733 |
| 2004/0153926 A1 | 8/2004 | Abdel-hafez et al. | |
| 2004/0246337 A1 * | 12/2004 | Hasegawa et al. | 348/189 |
| 2006/0136795 A1 | 6/2006 | Gunda et al. | |
| 2006/0195737 A1 * | 8/2006 | James | 714/726 |
| 2011/0099442 A1 * | 4/2011 | Hales et al. | 714/729 |
| 2011/0264971 A1 | 10/2011 | Bahl et al. | |

* cited by examiner

*Primary Examiner* — Fritz Alphonse
(74) *Attorney, Agent, or Firm* — Lawrence J. Merkel; Erik A. Heter; Meyertons, Hood, Kivlin, Kowert & Goetzel, P.C.

(57) ABSTRACT

A method and apparatus for detecting clock glitches during at-speed testing of integrated circuits is disclosed. In one embodiment, an integrated circuit includes a scan chain having a number of scan elements coupled in a series configuration. Each of the scan elements is coupled to receive a clock signal that may be cycled during a test operation. A subset of the scan elements are arranged to form, along with other components, a counter. Test stimulus data shifted into the scan chain to perform a test may include an initial count value that is shifted into the scan elements of the counter. When the test is performed, the count value is updated responsive to cycling of the clock signal. The updated count value is shifted from the counter along with other test result data, and may be used to determine if the number of clock cycles received during the test.

20 Claims, 5 Drawing Sheets

APPARATUS AND METHOD FOR CLOCK GLITCH DETECTION DURING AT-SPEED TESTING

BACKGROUND

1. Technical Field

This disclosure is directed to electronic circuits, and more particularly, to the testing of electronic circuits.

2. Description of the Related Art

For many electronic systems and devices, the manufacturing process concludes with one or more types of tests to ensure proper functionality and operation within specified limits. The types of testing that may be conducted are wide and varying, and may be suited to the particular system/device. One type of testing that may be conducted for integrated circuits is known as scan testing. In an integrated circuit, scan chains made up of a number of serially-coupled scan elements may be implemented. Each scan element may provide access to one or more internal nodes within the integrated circuit that are otherwise inaccessible. Test stimulus data may be shifted in through the scan chain and applied directly to nodes coupled to the scan elements. After applying the test stimulus data, one or more clock cycles may be applied to the circuitry under test in order to cause logical transitions. Test result data may then be captured by scan elements and shifted from the integrated circuit to external test equipment, where it may be analyzed to determine if any failures occurred.

In some cases, the testing described above may be conducted 'at-speed', i.e. with the clock signal cycled at an operational frequency. At-speed testing may be useful to determine whether the tested circuitry performs under operating conditions that are likely to be encountered by the integrated circuit when implemented in an electronic system.

SUMMARY

A method and apparatus for detecting clock glitches during at-speed testing of integrated circuits is disclosed. In one embodiment, an integrated circuit includes a scan chain having a number of scan elements coupled in a series configuration. Each of the scan elements is coupled to receive a clock signal that may be cycled during a test operation. A subset of the scan elements are arranged to form, along with other components, a counter. Test stimulus data shifted into the scan chain to perform a test may include an initial count value that is shifted into the scan elements of the counter. When the test is performed, the count value is updated responsive to cycling of the clock signal. The updated count value is shifted from the counter along with other test result data. The updated count value may be used to determine if a number of clock cycles were received during the test.

In one embodiment, a method includes shifting test stimulus data into a scan chain of an integrated circuit, the scan chain including a number of scan elements coupled in series. The test stimulus data includes an initial count value that is applied to a subset of the scan elements that form a counter. During the test, a number of clock pulses may be applied to the scan elements of the scan chain, including those scan elements that form the counter. Upon completion of the testing, test result data may be shifted from the scan chain. The test result data includes the final count value of the counter. The final count value may be used to determine if a correct number of clock pulses were received by the scan elements of the scan chain during the test. An incorrect number of clock pulses may indicate that a clock glitch occurred during the test and may thus be useful in identifying a root cause for an overall failure of the test.

BRIEF DESCRIPTION OF THE DRAWINGS

The following detailed description makes reference to the accompanying drawings, which are now briefly described.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Figure 1:
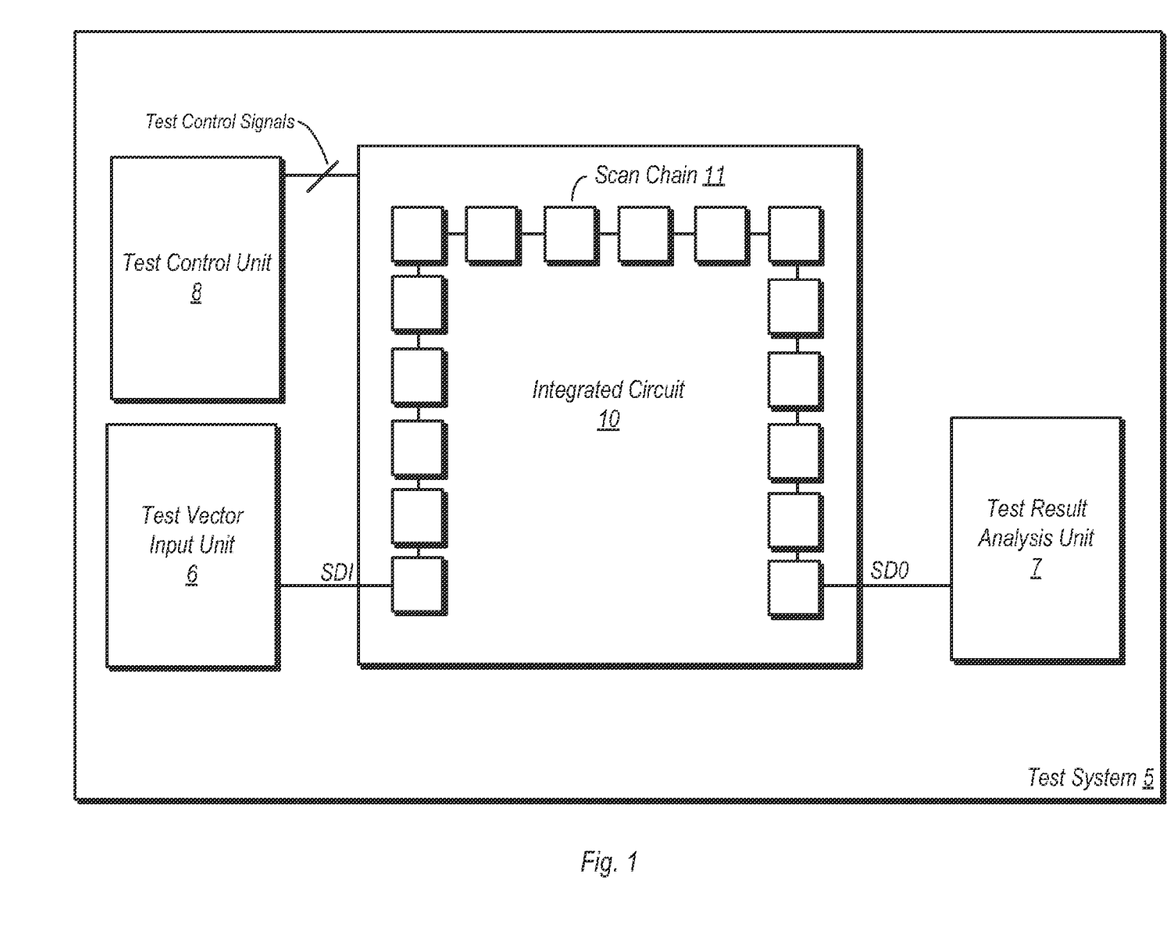
FIG. 1 is a block diagram of one embodiment on an integrated circuit test system with an integrated circuit as a device under test (DUT).

Turning now to FIG. 1, a block diagram of one embodiment on an integrated circuit test system with an integrated circuit as a device under test (DUT) is shown. In the embodiment shown, test system 5 is configured to provide test stimulus data and test control signals to integrated circuit 10. Test system 5 is further configured to provide test control signals to integrated circuit 10 in order to control various functions for setting up a test, performing a test, and extracting test result data.

In the embodiment shown, integrated circuit 10 includes a scan chain 11 having a number of serially coupled scan elements. Test stimulus data may be shifted into integrated circuit 10 from test vector input unit 6 through a scan data input ('SDI'). The test stimulus data may be serially shifted through the scan chain until each bit has been received by a targeted one of the scan elements. Although not shown in this drawing, scan elements of the scan chain may be coupled to logic circuitry of integrated circuit 10. Using these scan elements, test stimulus data may be applied to circuit nodes that are otherwise inaccessible by external pins of integrated circuit 10. Moreover, scan elements may also be coupled to receive data from logic circuitry of integrated circuit 10, and thus test result data may be obtained from circuit nodes that are otherwise inaccessible.

In order to initiate a test, test control unit 8 may provide one or more control signals to integrated circuit 10, while test vector input unit 6 may provide test stimulus data through the scan data input. Test control signals may include signals such as scan enable signals, scan clock signals, and so on. The test control signals may be used to cause test stimulus data to be shifted into the scan elements of scan chain 11 until each bit of test data has been provided to a target scan element.

After each bit of test stimulus data has been provided to its target scan element, the actual test may commence. Control signals generated by test control unit 8, along with internally generated clock signals, may cause various ones of the scan elements to apply test stimulus data to various logic circuits in integrated circuit 10. The logic circuits may react to the test stimulus data to generate test result data. On a subsequent clock cycle, the test result data may be captured by various ones of the scan elements. After that, test control unit 8 may once again initiate shift operations to shift the test result date from integrated circuit 10 to test result analysis unit 7, through the scan data output ('SDO'). Test result analysis unit 7 may then perform the received test result data to expected data to determine if the test passed or failed. Additionally, test result analysis unit 7 may identify logic circuitry associated with any failures.

In one embodiment, testing of integrated circuit 10 may be conducted at an operational clock speed. That is, the clock signals that are provided to logic circuits in integrated circuit 10 during testing may have a frequency that is the same as a frequency used for normal operation. However, in some cases, clock glitches can occur due to various factors, thereby causing an undesirable number of clock cycles to be applied during the actual testing. For example, it may be desired to apply two cycles of a clock signal during a test, but due to noise in the clocking subsystem, a glitch can make it appear as if three clock cycles were applied. Circuits internal to integrated circuit 10, including the scan elements of scan chain 11, may generate erroneous test results if an unintended number of clock cycles are applied during test. Accordingly, integrated circuit 10, as will now be discussed below, is configured to count the actual number of clock cycles received during a test. Data indicative of the number of clock cycles received during the test may be provided to test result analysis unit 7 and may be used to determine the exact number of clock cycles received during the test. This may aid in determining the causes of any other test failures, particularly when it is determined that the number of clock cycles received was different from that which was intended.

Figure 2:
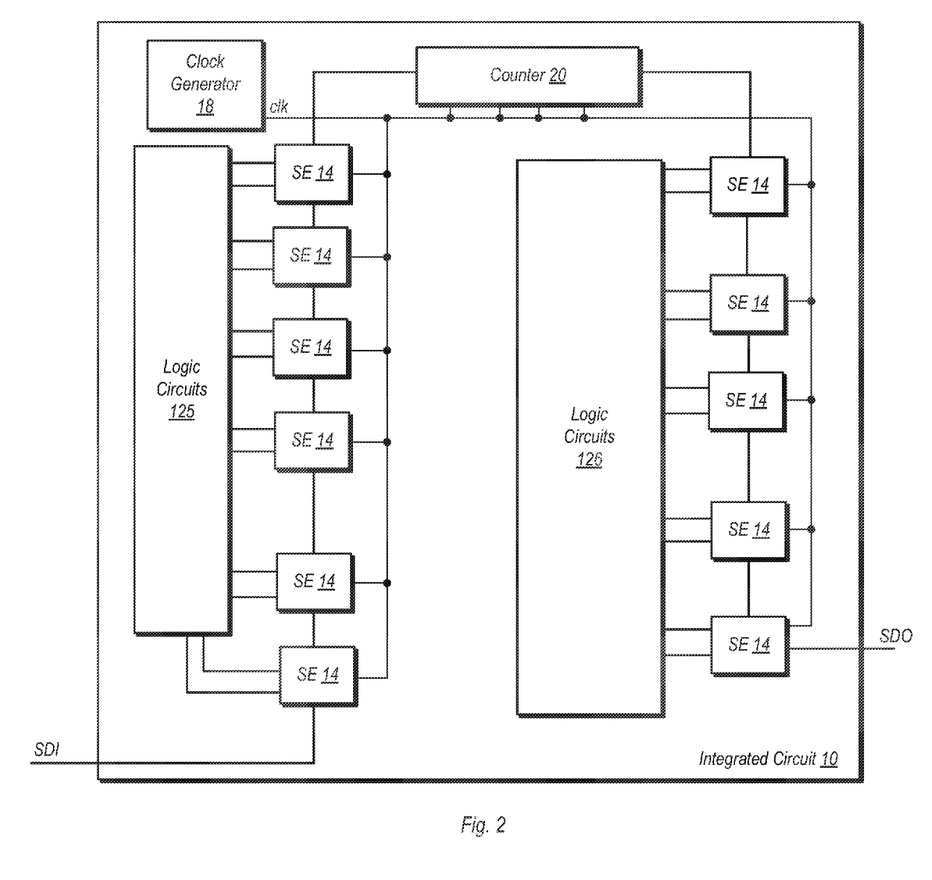
FIG. 2 is a block diagram of one embodiment of an integrated circuit having a scan chain.

FIG. 2 is a block diagram of an exemplary embodiment of an integrated circuit having a scan chain. In the embodiment shown, integrated circuit 10 includes a scan chain having a number of scan elements 14 coupled in series. The scan chain further includes counter 20, which is also made up of scan elements, some of which may be similar or the same as scan elements 14, while others may be different. One embodiment of counter 20, implemented as a linear feedback shift register, is discussed further below in reference to FIG. 3. In various embodiments, counter 20 may also be implemented as a binary counter, a gray code counter, or any other suitable counter type. Counter 20 may also be implemented in any size suitable for the particular embodiment in which it is to be used. In one embodiment, the scan elements that make up counter 20 are coupled in series, and thus counter 20 overall is coupled in series with the other scan elements 14. Test stimulus data and test result data may be shifted through the scan elements of the scan chain in the direction moving from the scan data input to the scan data output.

Integrated circuit 10 includes logic circuit 125 and 126. These logic circuits may perform the various functions that integrated circuit 10 is intended to carry out. Logic circuits 125 and 126 may include both sequential and combinational logic circuits. Individual nodes of at least some of the logic circuits 125 and 126 are coupled to various ones of scan elements 14. Each of the scan elements 14 shown is coupled to one of the logic circuit blocks may provide test stimulus data to a node associated with a logic circuit and may also receive test result data from another node associated with a logic circuit. It is noted that in some cases, a scan element 14 may be implemented solely for the purpose of applying test stimulus data or capturing test result data.

Integrated circuit 10 in the embodiment shown also includes a clock generator 18, which may be implemented using any suitable type of clock circuitry. Clock generator 18 is coupled to provide a clock signal ('clk') to each of scan elements 14, as well as the scan elements of counter 20. Although not explicitly shown, clock generator 18 may also provide the clock signal to various ones of logic circuits 125 and 126. The clock signal may be used to synchronize the operation of circuits in integrated circuit 10 when performing its intended function. In some embodiments, the clock signal provided by clock generator 18 may also be used to synchronize scan shifting operations during the inputting of test stimulus data or the outputting of test result data. Embodiments are also possible and contemplated wherein separate scan clock signals may be generated to synchronize scan shifting operations. Such scan clock signals may be generated internally to integrated circuit 10 or externally thereto and provided through an input pin.

Figure 3:
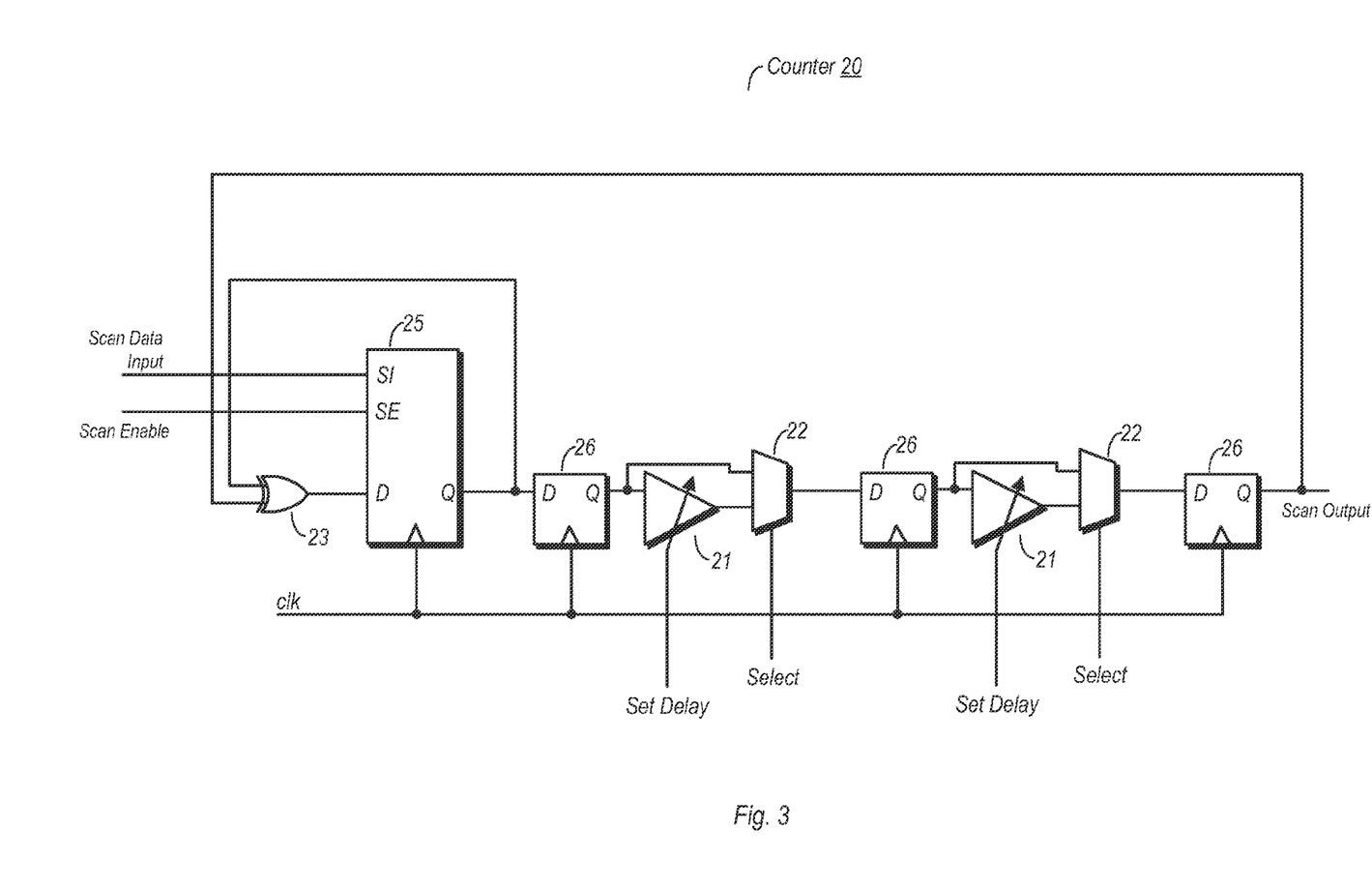
FIG. 3 is a block diagram of one embodiment of a counter implemented using scan elements of a scan chain.

FIG. 3 is a block diagram of one embodiment of a counter implemented using scan elements of a scan chain. In the embodiment shown, counter 20 is implemented as a linear feedback shift register (LFSR), although other types of counters may be utilized on other embodiments. Implementing counter 20 as an LFSR may provide the advantage of compactness, as an LFSR is generally smaller than other types of counters.

Counter 20 in the embodiment shown includes one scan element of a first type, scan element 25, and three scan elements 26 of a second type. These scan elements form a subset of the scan chain discussed above, with the other scan elements forming another subset. Scan element 25 and/or scan elements 26 may be equivalent to scan elements 14 previously discussed above, or may be different altogether. Furthermore, embodiments in which all of the scan elements of counter 20 are of the same type are also possible and contemplated. Each of the scan elements 25 and 26 of counter 20 are coupled to receive the clock signal generated by clock generator 18 of FIG. 2. Output values for each of these scan elements may be updated each time a clock pulse is received. The scan elements may be triggered on a positive edge of the clock or on a negative edge of the clock.

Scan element 25 includes a scan data input ('SI') and a scan enable input ('SE'). Data may be received into scan element 25 when the scan enable signal is asserted on the scan enable input. When the scan enable signal is de-asserted, scan element 25 may receive data through a normal data input ('D'). In the embodiment shown, the normal data input of scan element 25 is coupled to the output of exclusive OR (XOR) gate 23. A first input of XOR gate 23 is coupled to the output of scan element 25. A second input of XOR gate 23 is coupled to an output of the last scan element 26, which provides the scan output for counter 20. During operation of counter 20, the values from the output of scan element 25 and the last scan element 26 are fed back to XOR gate 23, which may then update the data input of scan element 25 accordingly. The output of scan element 25 may also be shifted into the next scan element 26 of counter 20, with the same value being shifted to the other scan elements 26 during subsequent cycles of the clock signal.

In the embodiment shown, counter 20 includes two programmable delay elements 21 and correspondingly coupled multiplexers 22 that are coupled between scan elements 26. The delay of the programmable delay elements 21 may be set by a corresponding signal ('Set Delay') that may be received from an external source (e.g., a test system) or from a source internal to integrated circuit 10. A corresponding select signal may be provided to each of multiplexer 22, which may then select whether to pass the output of the correspondingly coupled delay element 21 or to bypass the delay element 21 altogether. The delay provided by each delay elements 21 may be tuned (or bypassed) according to an expected clock frequency to fine tune the operation of counter 20.

During the shifting in of test stimulus data, a known count value may be shifted into counter 21. During actual test, the count value of counter 20 may be updated for each clock pulse received. This may include intended clock pulses, as well as unintended clock pulses from glitches, reflections, or other phenomena. In some cases, reflections or other noise may cancel out intended clock pulses. In either case, counter 20 may generate an updated count value based on the number of clock pulses actually received thereby during actual testing. The updated count value may be shifted out from integrated circuit 20 along with other test result data that was generated during the test.

The updated count value may be analyzed and used to determine if a correct number of clock pulses were received by the various logic circuits of integrated circuit 10 during the actual test. An incorrect number of clock pulses may be used to diagnose a cause for a test failure of other circuits under test. A correct number of clock pulses may indicate that any other failing circuits likely failed due to reasons other than clocking.

Figure 4:
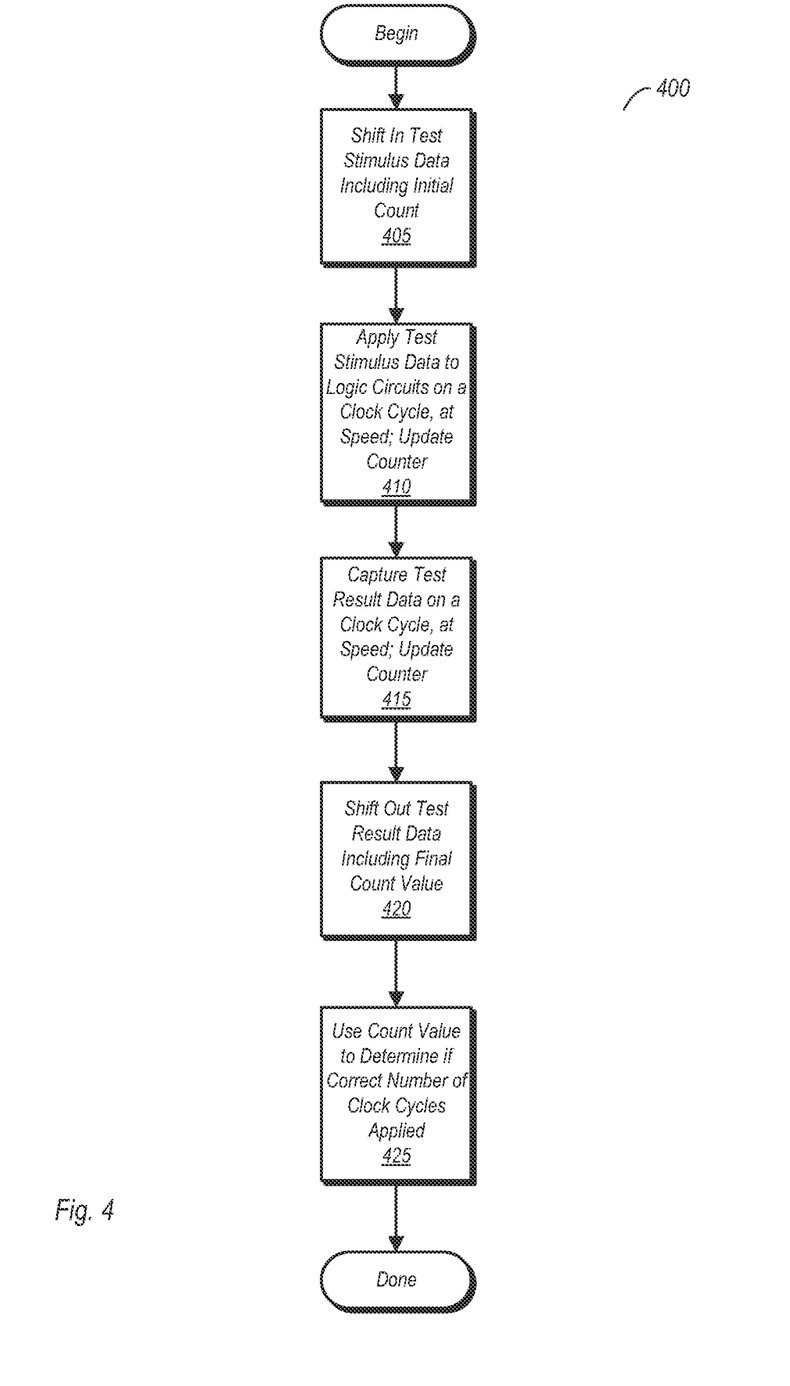
FIG. 4 is a flow diagram illustrating one embedment of a method for determining if a correct number of clock pulses were received during a scan test.

FIG. 4 is a flow diagram illustrating one embedment of a method for determining if a correct number of clock pulses were received during a scan test. Method 400 may be performed by various embodiments of the hardware discussed above. Furthermore, method 400 may also be performed by hardware embodiments not explicitly discussed herein.

Method 400 begins with the shifting of test stimulus data into a scan chain having a number of serially coupled scan elements (block 405). The test stimulus data includes an initial count value to be provided to a counter having a number of scan elements that are part of the scan chain. In one embodiment, the counter may be a linear feedback shift register.

After the test stimulus data has been fully shifted in, with each bit being received by a target scan element, test stimulus data may be applied to the logic circuits and a clock pulse may be provided thereto (block 410). Additionally, the count value of the counter may be updated responsive to the clock pulse.

Clock pulses may be applied during testing at speed, i.e. at a clock frequency that is normal for operation of the integrated circuit under test.

Subsequent to the applying of test stimulus data, at least one more clock pulse it provided to capture test result data (block 415). The counter may once again be updated responsive to the clock pulse, and the test result data may thus include an indication of the final count value of the counter. It is noted that in some instances, one or more clock pulses may be provided to the scan elements between the initial clock pulse (in which test stimulus data is applied) and the final clock pulse (in which test result data is capture). In other instances, only the two clock pulses described above may be applied.

After the capture cycle, another scan shift operation may be performed in order to shift the test result data from the integrated circuit to a location where it can be observed and analyzed (block 420). As previously noted, the test result data includes and indication of the final count value. Using the indication of the final count value, a determination may be made as to whether the intended number of clock cycles were provided to the various logic circuit of the integrated circuit during the test (block 425). If a correct number of clock cycles were provided, clocking may be eliminated as a cause of any failures. Otherwise, if an incorrect number of clock cycles were provided (e.g., due to clock glitches interpreted as clock pulses), clocking may be identified as one possible source of any failures that occurred during the test.

Figure 5:
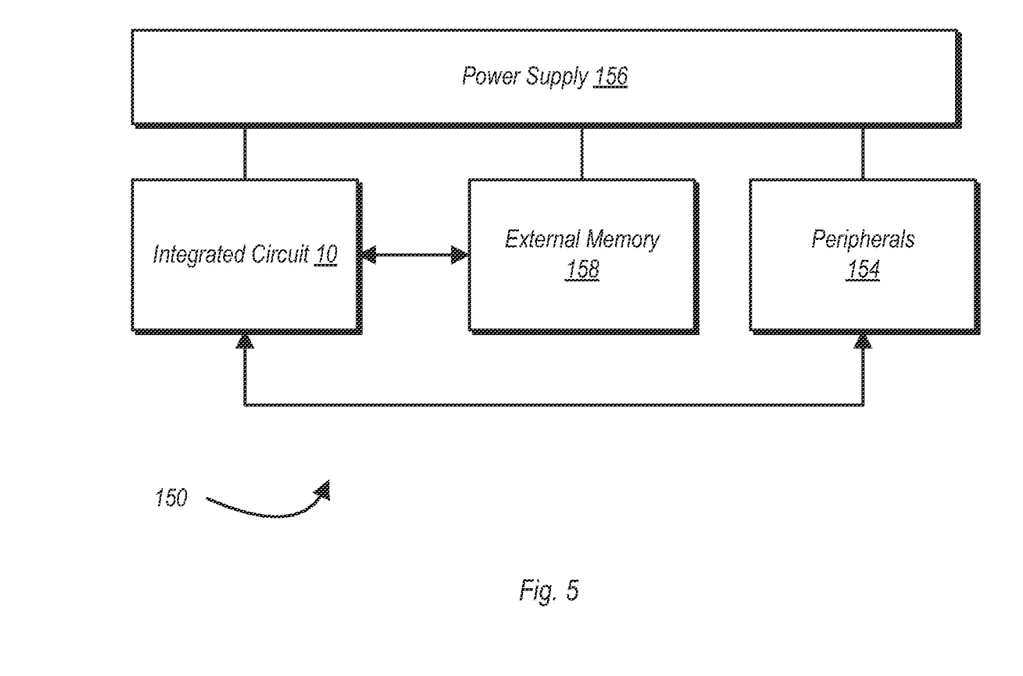
FIG. 5 is a block diagram of one embodiment of a system.

Turning next to FIG. 5, a block diagram of one embodiment of a system 150 is shown. In the illustrated embodiment, the system 150 includes at least one instance of an IC 5 (e.g., that implements SoC 10 of FIG. 1) coupled to one or more peripherals 154 and an external memory 158. A power supply 156 is also provided which supplies the supply voltages to the IC 10 as well as one or more supply voltages to the memory 158 and/or the peripherals 154. In some embodiments, more than one instance of the IC 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
a scan chain including a plurality of serially-coupled scan elements each coupled to receive a clock signal;
wherein a first subset of the plurality of serially-coupled scan elements is configured to form a counter configured to count a number of clock cycles provided during a scan test;
wherein a first one of the subset of serially-coupled scan elements is of a first scan element type, and wherein remaining ones of the subset of serially-coupled scan elements are of a second type; and
wherein the first one of the subset of serially-coupled scan elements includes a scan input, a scan enable input, and a data input, wherein the first one of the subset of serially-coupled scan elements is configured to receive data through the scan input when an enable signal is asserted on the scan enable input, and wherein the first one of the subset of serially-coupled scan elements is configured to receive data through the data input when the enable signal is not asserted.

2. The integrated circuit as recited in claim 1, wherein the counter is one of the following type of counters: a linear feedback shift register, a binary counter, or a gray code counter.

3. The integrated circuit as recited in claim 1, wherein the counter includes one or more programmable delay elements coupled between selected ones of the first subset of serially-coupled scan elements.

4. A method comprising:
shifting an initial count value into a counter including a first subset of scan elements of a plurality of serially-coupled scan elements forming a scan chain within an integrated circuit;
providing a plurality of clock pulses to each of the plurality of scan elements;
shifting test output data from the scan chain subsequent to said providing, wherein the test output data includes a final count value of the counter; and
determining if a desired number of clock pulses were provided to the scan chain based on the final count value;
wherein the method further comprises delaying a signal conveyed between an output of a first scan element of the first subset and an input of a second scan element of the first subset.

5. The method as recited in claim 4, further comprising providing an output of the counter to a first input of an exclusive OR gate, wherein a second input of the exclusive OR gate is coupled to an output of a first one of the scan elements of the first subset of serially-coupled scan elements.

6. The method as recited in claim 4, further comprising asserting a scan enable signal to an enable input of a selected scan element of the first subset during said shifting an initial count value and shifting test output data, and de-asserting the scan enable signal during said providing the plurality of clock pulses.

7. The method as recited in claim 4, further comprising:
applying, prior to said providing the plurality of clock pulses, test stimulus data to logic circuits coupled to scan elements of a second subset of the plurality of coupled scan elements; and
capturing, subsequent to said providing the plurality of clock pulses, test result data from the logic circuits coupled to scan elements of the second subset.

8. An integrated circuit comprising:
a plurality of logic circuits; and
a scan chain comprising a first plurality of scan elements and a second plurality of scan elements coupled in a serial configuration, wherein the first plurality of scan elements forms a counter circuit and wherein scan elements of the second plurality are coupled to selected ones of the plurality of logic circuits;
wherein the counter circuit is configured to count a number of cycles of a clock signal provided to the scan elements of the first and second pluralities during a test;
wherein the counter is a linear feedback shift register having an exclusive OR gate coupled to receive, as a first input, feedback from an output of the counter circuit, and further coupled to receive, as a second input, feedback from a first one of the first plurality of scan elements.

9. The integrated circuit as recited in claim 8, wherein the first one of the first plurality of scan elements includes a first input coupled to an output of the exclusive OR gate, and a second input coupled to receive data from one of the second plurality of scan elements.

10. The integrated circuit as recited in claim 9, wherein the first one of the first plurality of scan elements is configured to receive data through the first input during test operations and is further configured to receive data through the second input during scan shifting operations.

11. The integrated circuit as recited in claim 8, further comprising a clock source coupled to provide the clock signal to each of the first and second pluralities of scan elements.

12. A method comprising:
shifting test stimulus data into a plurality of scan elements of a scan chain implemented in an integrated circuit, wherein the scan chain includes a first subset of scan elements arranged to form a counter, and wherein said shifting include shifting an initial count value into the counter;
providing, during a test, a plurality of clock pulses to the plurality of scan elements at an operational clock frequency, wherein the plurality of clock pulses includes at least one clock pulse to apply test stimulus data to logic circuits from a second subset of scan elements and at least one clock pulse to capture test result data from the logic circuits; and
shifting out test result data from the plurality of scan elements, wherein the test result data includes a count value generated by the counter, the count value indicating the number of clock pulses received during the test.

13. The method as recited in claim 12, further comprising the counter providing, during the test, feedback from a first scan element of the counter to a first input of an exclusive OR gate, and feedback from an output of the counter to a second input of the exclusive OR gate.

14. The method as recited in claim 13, further comprising delaying a signal conveyed between second and third scan elements of the counter using a programmable delay element.

15. The method as recited in claim 14, further comprising delaying a signal conveyed between third and fourth scan elements of the counter using a programmable delay element.

16. The method as recited in claim 13, further comprising the first scan element receiving data through a scan input during said shifting of test stimulus data, and receiving data through a second input coupled to an output of the exclusive OR gate during the test.

17. An integrated circuit comprising:
a scan chain having a scan input, a scan output, and a plurality of scan elements coupled between the scan input and scan output;
a linear feedback shift register, wherein the linear feedback shift register includes a first subset of the plurality of scan elements, wherein the linear feedback shift register is configured to count a number of clock pulses received during operation in a test mode; and
a plurality of logic circuits, wherein a second subset of the plurality of scan elements are coupled to the plurality of logic circuits;
wherein a second subset of the plurality of scan elements is coupled to provide test stimulus data to the plurality of logic circuits and further coupled to receive test result data from the plurality of logic circuits.

18. The integrated circuit as recited in claim 17, further comprising a clock circuit configure to generate a clock signal provided to each of the plurality of scan elements.

19. The integrated circuit as recited in claim 17, wherein the linear feedback shift register includes:

a first scan element of a first type, wherein the first scan element includes a first data input coupled to receive data from a scan data input path, and a second data input; and
an exclusive OR gate coupled to receive, as a first input, an output from the first scan element, and further coupled to receive, as a second input, an output from the linear feedback shift register, wherein an output of the exclusive OR gate is coupled to the second data input of the first scan element.

20. The integrated circuit as recited in claim 19, wherein the linear feedback shift register further includes:
second, third, and fourth scan elements, wherein the second third and fourth scan elements are of a second type, wherein the first scan element of the second type is coupled to receive an output from the first scan element;
a first programmable delay circuit coupled between the second and third scan elements; and
a second programmable delay circuit coupled between the third and fourth scan elements.

* * * * *